(12) United States Patent
Yoshida et al.

(10) Patent No.: US 11,891,159 B2
(45) Date of Patent: Feb. 6, 2024

(54) UNMANNED WATERCRAFT

(71) Applicant: Japan Agency for Marine-Earth Science and Technology, Kanagawa (JP)

(72) Inventors: Hiroshi Yoshida, Yokosuka (JP); Tadahiro Hyakudome, Yokosuka (JP); Ryotaro Suga, Yokosuka (JP); Takashi Yoshioka, Yokosuka (JP); Hisashi Sugiura, Osaka (JP); Hideki Endou, Kunisaki (JP); Yasuhiro Ueda, Osaka (JP); Yuichiro Dake, Osaka (JP); Tomoya Fukukawa, Osaka (JP); Ryuji Nakazono, Kunisaki (JP)

(73) Assignee: Japan Agency for Marine-Earth Science and Technology, Yokosuka (JP)

( * ) Notice: Subject to any disclaimer, the term of this patent is extended or adjusted under 35 U.S.C. 154(b) by 681 days.

(21) Appl. No.: 16/970,957

(22) PCT Filed: Jan. 25, 2019

(86) PCT No.: PCT/JP2019/002415
§ 371 (c)(1),
(2) Date: Aug. 19, 2020

(87) PCT Pub. No.: WO2019/163397
PCT Pub. Date: Aug. 29, 2019

(65) Prior Publication Data
US 2020/0391839 A1  Dec. 17, 2020

(30) Foreign Application Priority Data
Feb. 21, 2018 (JP) .................. 2018-028965

(51) Int. Cl.
*B63H 21/38* (2006.01)
*H05K 5/04* (2006.01)
*H05K 7/20* (2006.01)

(52) U.S. Cl.
CPC .............. *B63H 21/38* (2013.01); *H05K 5/04* (2013.01); *H05K 7/20272* (2013.01); *H05K 7/20872* (2013.01)

(58) Field of Classification Search
CPC ...... B63H 21/38; H05K 5/04; H05K 7/20272; H05K 7/20872
See application file for complete search history.

(56) References Cited

U.S. PATENT DOCUMENTS

| 2006/0046583 | A1* | 3/2006 | Lawson | B63H 11/08 440/38 |
| 2008/0287016 | A1* | 11/2008 | Grimmeisen | A63B 35/12 440/6 |
| 2012/0276794 | A1* | 11/2012 | Mulligan | B63C 9/00 441/80 |

* cited by examiner

*Primary Examiner* — Stephen P Avila

(57) ABSTRACT

The present invention provides an unmanned watercraft capable of sufficiently cooling equipment that generates a large amount of heat, capable of cooling such equipment without using energy in the watercraft, and capable of improving mean time between failures (MTBF) of a cooling device. An unmanned watercraft 1 has a cooling structure CS for cooling a central processing unit CPU1 for image recognition and a central processing unit CPU2 for control that constitute a central processing unit CPU as a heat-generating body. The cooling structure CS includes a waterproof container 7 that accommodates the heat-generating body (an insulating envelope that surrounds the heat-generating body in an electrically insulated state). The waterproof container 7 is arranged outside a submerged part 3 of the unmanned watercraft 1 so as to be in contact with water (Continued)

present outside the unmanned watercraft 1, the submerged part 3 being submerged in water.

12 Claims, 4 Drawing Sheets

UNMANNED WATERCRAFT

CROSS-REFERENCE

This application is a US National Stage Application under 35 U.S.C. § 371 of International Application No. PCT/JP2019/002415 filed Jan. 25, 2019, which claims foreign priority of JP2018-028965 filed Feb. 21, 2018 the disclosures of which are hereby incorporated by reference in their entirety.

TECHNICAL FIELD

The present invention relates to an unmanned watercraft with a cooling structure for cooling a heat-generating body.

BACKGROUND ART

Undersea research and seafloor research using autonomous underwater vehicles (AUVs) has actively been conducted. It has been requested to improve research accuracy, extend a research area, and reduce research cost. However, there is a problem that the AUV needs to be accompanied by a mother ship sailing on the water and, when a large number of the AUVs are to be operated, the number of mother ships has to be increased accordingly. The mother ship is a vessel that crew members board for acoustic positioning and monitoring of the AUV, and it is difficult to increase the number of the mother ships from an aspect of cost.

For the above reason, recently, an autonomous surface vehicle (ASV: an unmanned watercraft also called an offshore robot or an offshore repeater), which accompanies the AUV in place of the mother ship, has been developed. The ASV is a robot that accompanies the AUV and relays between the AUV and the mother ship or an onshore control center by wireless communication such as satellite communication. Use of the ASV can lower a daily rate (work cost per day) when compared to use of the mother ship, and thus is expected to lower research cost.

A large number of heat-generating bodies are mounted on the ASV. Such heat-generating bodies are: communication equipment for communication with the mother ship and the like; an acoustic communication equipment for communication with the AUV; and electrical equipment and/or electronic equipment including a microcomputer, a power circuit, and the like for controlling autonomous navigation. In the ASV, these heat-generating bodies have to be cooled while sailing.

Conventionally, the heat-generating bodies, which include the electrical equipment and/or the electronic equipment installed in the watercraft, are cooled by using an air conditioner mounted on the ASV. Meanwhile, although not specified as the ASV, the related art of a cooling device for cooling a heat-generating body installed in the watercraft is disclosed in Japanese Unexamined Patent Application Publication No. 2017-85063 (Patent Literature 1) and Japanese Unexamined Patent Application Publication No. 2015-196407 (Patent Literature 2).

The technique disclosed in Patent Literature 1 includes: a radiator plate with a cooling pipe running through the inside; and a seawater pump that delivers seawater to a cooling pipe, and cools the heat-generating body by bringing the radiator plate into contact with the heat-generating body. In the technique disclosed in Patent Literature 2, a radiator as the heat-generating body is arranged in close contact with a draft section, and heat of the heat-generating body is radiated to water via the draft section, and the heat-generating body is thereby cooled.

CITATION LIST

Patent Literature

Patent Literature 1: Japanese Unexamined Patent Application Publication No. 2017-85063
Patent Literature 2: Japanese Unexamined Patent Application Publication No. 2015-196407

DISCLOSURE OF INVENTION

Problems to be Solved by the Invention

In both of the above cooling methods in the related art, energy in the ASV is used to cool a heat-generating body. That is, not only the case of the air conditioner, but also the energy is required to drive the seawater pump for delivering seawater in the technique disclosed in Patent Literature 1, and the energy is required to circulate a refrigerant through the radiator in the technique disclosed in Patent Literature 2. The ASV cannot receive the energy from the outside while sailing. Thus, there is a problem in the unmanned watercraft, such as the ASV, of minimizing the amount of energy used to cool the heat-generating body.

In addition, failures of equipment that actively operates (active equipment) such as the air conditioner and the seawater pump are inevitable, and there is also a problem that it is difficult to improve mean time between failures (MTBF).

Furthermore, in any of the conventional cooling techniques described above, both the heat-generating body and the cooling device are installed in the watercraft. Thus, a worker has to board the watercraft for maintenance. For this reason, there is a problem that the ASV has to be designed with the assumption that the worker boards the watercraft.

The object of the present invention is to provide an unmanned watercraft capable of sufficiently cool a heat-generating body that generates a large amount of heat, capable of cooling such a heat-generating body without using energy in the watercraft, and capable of improving mean time between failures (MTBF) of a cooling device.

Another object of the present invention is to provide an unmanned watercraft that allows maintenance of equipment without a need for a worker to board the watercraft.

Means for Solving the Problems

The present invention relates to an unmanned watercraft that includes the above ASV. The unmanned watercraft has a cooling structure for cooling a heat-generating body that includes electrical equipment and/or electronic equipment. The cooling structure includes an insulating envelope that surrounds the heat-generating body in an electrically insulated state. The insulating envelope is arranged outside a submerged part of the unmanned watercraft so as to be in contact with water present outside the unmanned watercraft, the submerged part being submerged in water. The insulating envelope only needs to surround the heat-generating body and may be in close contact with the heat-generating body, or may be a container that accommodates the heat-generating body. Even when the heat-generating body itself is not arranged in the insulating envelope, the heat-generating body and the insulating envelope may thermally be connected via heat transfer means such a heating pipe.

According to the present invention, the heat-generating body, which includes the electrical equipment and/or the electronic equipment, is surrounded by the insulating envelope. Thus, even when the insulating envelope comes in contact with water (including a state where the insulating envelope is immersed in water), the electrical equipment and/or the electronic equipment is operated without causing a short circuit. In addition, since the insulating envelope is arranged outside the submerged part of the unmanned watercraft, heat generated by the heat-generating body is dissipated to water via the insulating envelope. Therefore, the unmanned watercraft according to the present invention can cool the heat-generating body without using electricity as energy in the watercraft. By the way, the insulating envelope has to conduct the heat. Thus, at least a part of the insulating envelope that comes in contact with water preferably has a superior heat transfer property.

In addition, the cooling structure does not include equipment (active equipment) that actively operates a seawater pump and the like. Therefore, it is possible to improve the MTBF of the cooling structure. Furthermore, when the heat-generating body or the cooling structure has to be maintained, a worker does not have to board the watercraft. Therefore, the unmanned watercraft does not have to be designed to allow the worker to board the watercraft, and maintenance work can be carried out from the outside of the watercraft.

The insulating envelope may be a waterproof envelope. In the case where the heat-generating body is surrounded by the waterproof envelope, water does not enter the heat-generating body, which includes the electrical equipment and/or the electronic equipment. As a result, the above purpose can be achieved. Alternatively, the insulating envelope may be constructed of a waterproof container that accommodates the heat-generating body. In a case of the waterproof container, the waterproof container may be filled with gas such as air, may be filled with an insulating liquid such insulating oil or a fluorine-based inert liquid (an example: Fluorinert®), or may be filled with a solid substance such as waterproof jelly. Fluorinert® has the superior electrical insulation property and a superior heat transfer property and thus can favorably transfer the heat of the heat-generating body to the waterproof container. Thus, Fluorinert® is suitable for being enclosed in the waterproof container.

An arrangement position of the insulating envelope is not limited as long as the insulating envelope is arranged outside the submerged part of the unmanned watercraft. In addition, the submerged part of the unmanned watercraft may be formed with a recess that is opened outward, and the insulating envelope may be accommodated in the recess. With such a configuration, it is possible to reduce fluid resistance of the insulating envelope. In particular, when the submerged part of the unmanned watercraft and the insulating envelope are made flush, it is possible to further reduce the fluid resistance of the insulating envelope.

Equipment mounted on the unmanned watercraft and the heat-generating body in the insulating envelope can electrically be connected in any manner. In the case where the recess is provided in the submerged part and the insulating envelope is accommodated in the recess, the equipment and the heat-generating body are preferably and electrically connected via a connector that is arranged in the recess. In addition, maintainability is improved when the insulating envelope is fixed in the recess so as to be separable from a hull of the unmanned watercraft.

Any configuration can be adopted for heat transfer from the heat-generating body to the insulating envelope. In the case where at least a part of the insulating envelope that comes in contact with water is formed of a metal member, the heat-generating body only needs to be fixed in the insulating envelope in a manner to be able to transfer heat to the part of the insulating envelope that comes in contact with water. In this way, the heat of the heat-generating body can efficiently be dissipated.

Shapes and structures of the recess in the submerged part of the unmanned watercraft and the insulating envelope may be configured to suction water into the recess, to generate a water flow around the part of the insulating envelope that comes in contact with water, and to thereafter discharge the water in the generated water flow to outside the recess when the unmanned watercraft sails With such a configuration, after the fluid resistance of the insulating envelope is reduced, a contact area between the insulating envelope and water is increased. In this way, the heat can efficiently be dissipated.

More specifically, in a state where the insulating envelope is accommodated in the recess, a front clearance, a rear clearance, and a connection clearance may be provided between the recess and the insulating envelope, the front clearance being provided on a front side of the unmanned watercraft in a sailing direction and having a front opening that communicates with the outside, the rear clearance being provided on a rear side of the unmanned watercraft in the sailing direction and having a rear opening that communicates with the outside, and the connection clearance connecting the front clearance and the rear clearance. Then, a water channel may be formed from the front opening to the rear opening through the front clearance, the connection clearance, and the rear clearance.

In the case where such clearances are formed, it is further preferred to adopt a mechanism to increase a suction amount of water from the front opening. For example, by applying Bernoulli's principle that a velocity of the fluid increases and the pressure decreases when the channel is narrowed, width dimensions of the front opening, the front clearance, the rear opening, and the rear clearance may be determined such that a pressure of water flowing through the front opening and the front clearance becomes higher than a pressure of water flowing through the rear opening and the rear clearance. In addition, an attachment position of the heat-generating body may be determined such that, when a temperature of water around the front opening is increased by the heat of the heat-generating body, a convection flow is generated and a part of the insulating envelope near the front opening is higher in temperature than a part of the insulating envelope near the rear opening.

DESCRIPTION OF EMBODIMENTS

A detailed description will hereinafter be made on embodiments of an unmanned watercraft according to the present invention with reference to the drawings.

First Embodiment

[Overall Configuration]

Figure 1:
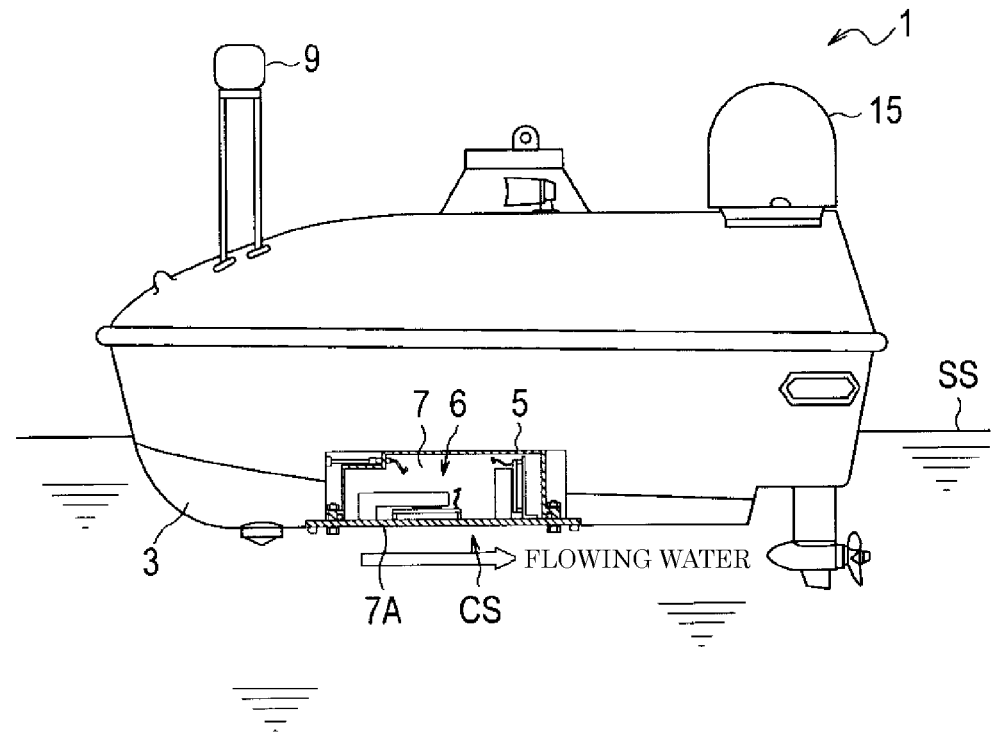
FIG. 1 is a side view illustrating an example of an unmanned watercraft according to a first embodiment of the present invention.
Figure 2:
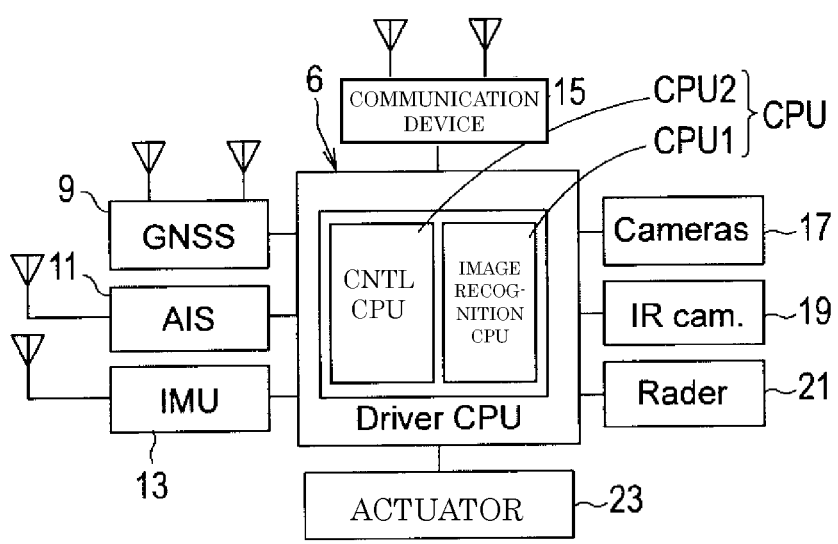
FIG. 2 is a block diagram of heat-generating bodies including electrical equipment and/or electronic equipment mounted on the unmanned watercraft.

FIG. 1 is a side view illustrating an example of an unmanned watercraft 1 according to a first embodiment of the present invention, and is a view only illustrating a cooling structure part in cross section such that the cooling structure part can be seen from the side. FIG. 2 is a block diagram of heat-generating bodies 6 including electrical equipment and/or electronic equipment mounted on the unmanned watercraft 1.

In this embodiment, the unmanned watercraft 1 is an offshore robot (ASV) that accompanies an autonomous underwater vehicle (AUV). The unmanned watercraft 1 floats on a sea surface SS illustrated at a center of the sheet for FIG. 1 and sails to the left of the sheet. That is, in this embodiment, water runs in a direction indicated by an arrow. A part of the unmanned watercraft 1 that is submerged will be defined as a submerged part 3.

An exterior package of the unmanned watercraft 1 is made of fiber-reinforced plastic (FRP). The submerged part 3 is formed with a recess 5 that is opened outward (downward on the sheet, which is a direction toward the seabed in this embodiment).

The recess 5 is a part of the submerged part 3 and is bottomed instead of being a through hole. The recess 5 accommodates a waterproof container 7. The waterproof container 7 constitutes an insulating envelope and accommodates the heat-generating bodies 6 including the electrical equipment and/or the electronic equipment. The waterproof container 7 is made of metal and is made by assembling parts that are processed metal plates. Details of the waterproof container 7 will be described below. The waterproof container 7 constitutes a cooling structure CS when the waterproof container 7 is accommodated in the recess 5 and a bottom wall 7A comes in contact with water that is present outside.

The unmanned watercraft 1 includes a central processing unit CPU1 for image recognition and a central processing unit CPU2 for control. The central processing unit CPU1 for image recognition and the central processing unit CPU2 for control constitute a central processing unit CPU that analyzes data from various types of the equipment and controls the various types of the equipment. The central processing units CPU1, CPU2 are connected to a global navigation satellite system (GNSS) 9 that determines a location of the unmanned watercraft 1, an automatic identification system (AIS) 11 that is a device automatically identifying the watercraft, an inertial measurement unit (IMU) 13 that detects behavior of the unmanned watercraft 1, a communication device 15 that communicates with a mother ship or an onshore control center, a camera 17 and an infrared camera 19 that capture images, a radar 21 for monitoring surroundings, an actuator 23 that controls the equipment of the unmanned watercraft 1, and the like. In this embodiment, the central processing units CPU1, CPU2 are main heat-generating sources and accommodated in the waterproof container 7.

[Cooling Structure]

Figure 3:
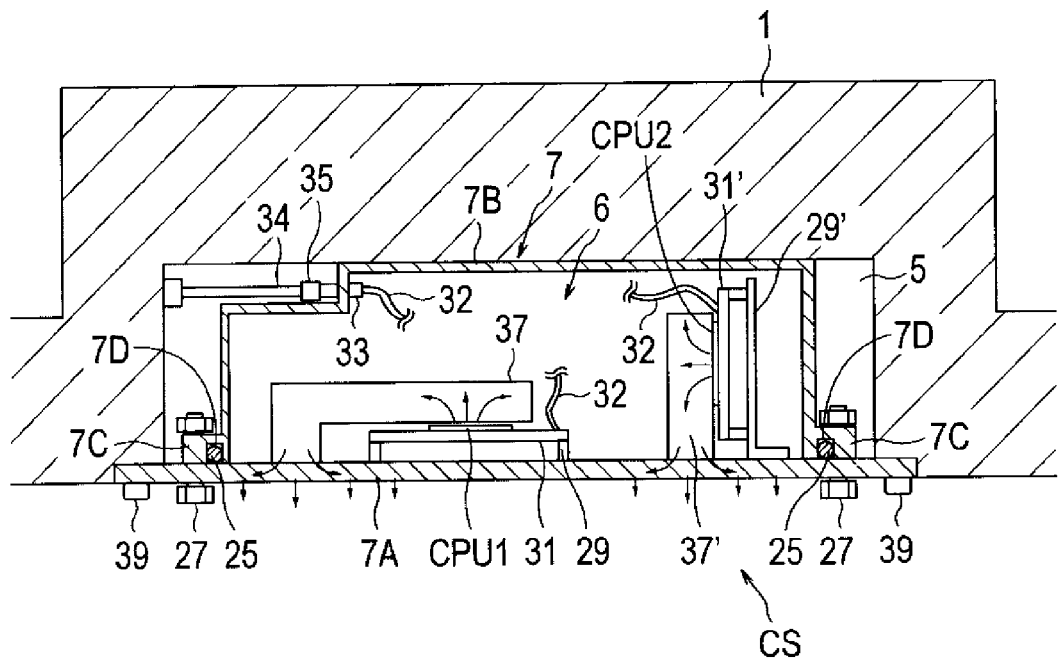
FIG. 3 is a cross-sectional view illustrating details of a cooling structure.

FIG. 3 is a cross-sectional view illustrating details of the cooling structure CS. A s described above, the waterproof container 7 constitutes the cooling structure CS when waterproof container 7 is accommodated in the recess 5 and the bottom wall 7A comes in contact with water that is present outside.

The waterproof container 7 is constructed of the plate-shaped bottom wall 7A and a container body 7B as a casing that has a surface opened and fixed to the bottom wall 7A. The container body 7B has a flange 7C in an opening thereof in an integrated manner. The flange 7C of the container body 7B is formed with an annular groove 7D in which an annular waterproof packing 25 is accommodated. When the bottom wall 7A and the container body 7B are joined by a fixture 27 including a bolt and a nut, the waterproof packing 25 is brought into a compressed state, and the waterproof container 7 is thereby kept watertight.

In this embodiment, the waterproof container 7 accommodates the central processing unit CPU1 for image recognition and the central processing unit CPU2 for control, which constitute the central processing unit CPU. The central processing unit CPU1 for image recognition is mounted on a printed circuit board 31 that is arranged on a spacer 29. The spacer 29 is fixed to the bottom wall 7A and has a favorable electrical insulation property. An electrical wire 32 (partially not illustrated) extends from the printed circuit board 31, on which the central processing unit CPU1 for image recognition is mounted, and is connected to a waterproof connector half 33 that is provided to the container body 7B of the waterproof container 7. An electrical wire 34 that is connected to the equipment (the GNSS 9, the AIS 11, and the like described above) mounted on the unmanned watercraft 1 is electrically connected to a waterproof connector half 35 arranged in the recess 5. When the waterproof connector half 35 is connected to the waterproof connector half 33, the equipment mounted on the unmanned watercraft 1 and the central processing unit CPU1 for image recognition are electrically connected. While the central processing unit CPU1 for image recognition is not in direct contact with the waterproof container 7, one end of the central processing unit CPU1 for image recognition is in contact with a surface of the central processing unit CPU1 for image recognition, and the other end thereof is thermally connected to the bottom wall 7A of the waterproof container 7 via a heat-conducting plate 37 that is in contact with the bottom wall 7A of the waterproof container 7. Similar to the central processing unit CPU1 for image recognition, the central processing unit CPU2 for control is mounted on a printed circuit board 31' when the printed circuit board 31' is fixed to the bottom wall 7A via a spacer 29'. A heat-conducting plate 37' is in contact with the central processing unit CPU2 for control and can transfer heat thereto. The heat-conducting plate 37' is fixed to the bottom wall 7A and can transfer heat thereto.

The waterproof container 7 has the container body 7B accommodated in the recess 5 and is fixed to a bottom of the unmanned watercraft 1 by a fixing screw 39. When the central processing unit CPU1 for image recognition and the central processing unit CPU2 for control, which constitute the central processing unit CPU, are operated and generate heat, the generated heat is transferred to the bottom wall 7A of the waterproof container 7 via the heat-conducting plates 37, 37' as indicated by arrows in FIG. 3, and is dissipated to water that is present outside the bottom wall 7A.

In this embodiment, the waterproof container 7 can be detached from a hull of the unmanned watercraft 1 when the fixing screw 39 is untightened from the outside of the unmanned watercraft 1 in a state of being lifted on land or the mother ship. Therefore, it is not necessary for a worker to board the unmanned watercraft 1 in order to carry out maintenance work of the waterproof container 7 and the central processing unit CPU in the waterproof container 7, or the like.

Second Embodiment

Figure 4:
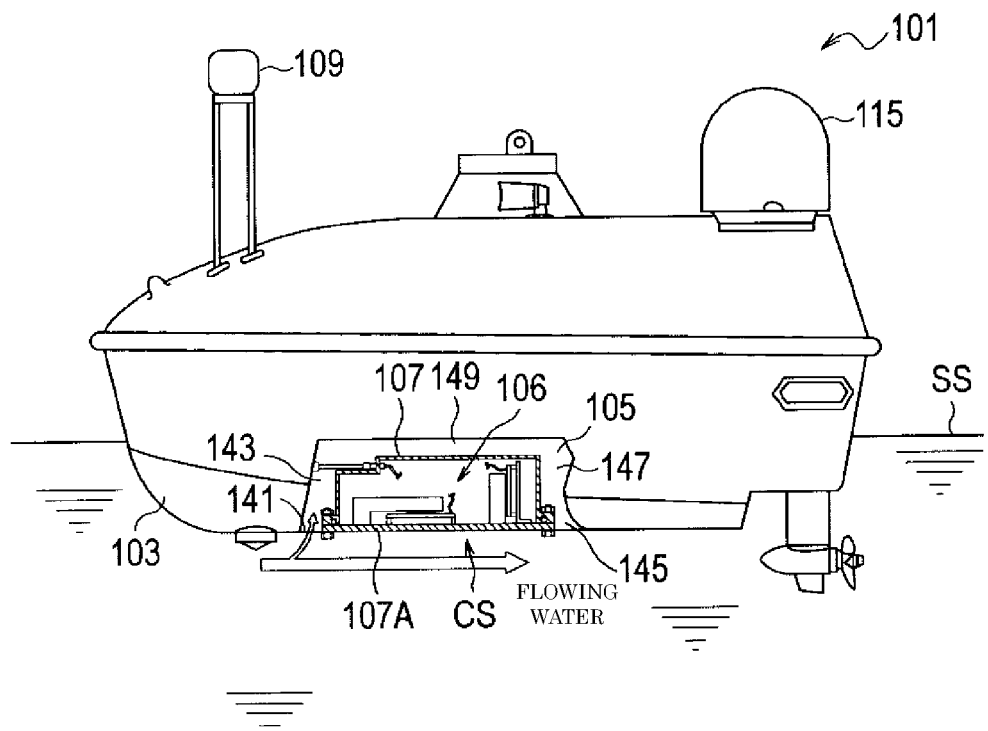
FIG. 4 is a side view illustrating an unmanned watercraft according to a second embodiment.
Figure 5:
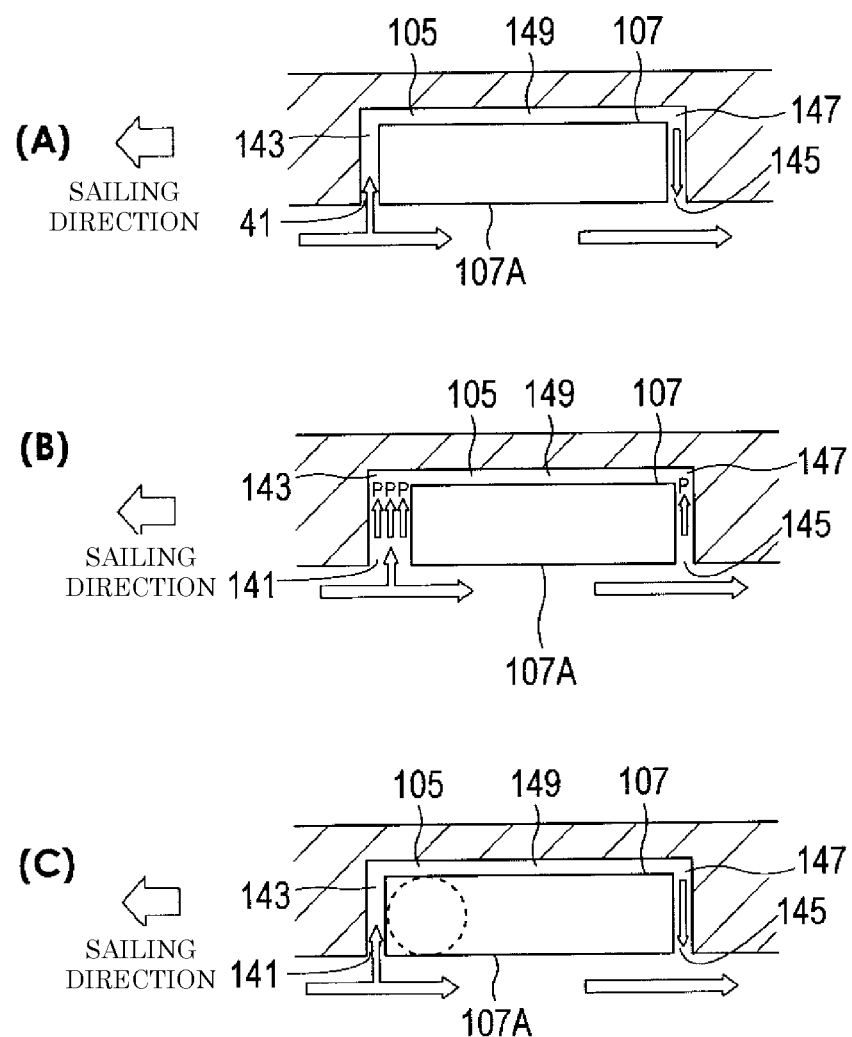
FIGS. 5A to 5C are schematic views of the cooling structure.

FIG. 4 is a side view illustrating an unmanned watercraft according to a second embodiment. Similar to FIG. 1, FIG. 4 only illustrates a cooling structure part in cross section such that the cooling structure part can be seen from the side. FIGS. 5A to 5C are schematic views of a cooling structure. Parts common to those in the first embodiment will be denoted by reference numerals that are obtained by adding 100 to those provided in FIG. 1 and FIG. 3, and a description thereon will not be made.

In the second embodiment, the cooling structure CS is configured that, when an unmanned watercraft 101 sails, water is suctioned into a recess 105 to generate a water flow around a waterproof container 107 and water is thereafter discharged from the recess 105. More specifically, in a state where the waterproof container 107 is accommodated in the recess 105, a front clearance 143, a rear clearance 147, and a connection clearance 149 are provided between the recess 105 and the waterproof container 107. The front clearance 143 is provided on a front side of the unmanned watercraft 101 in a sailing direction and has a front opening 141 that communicates with the outside. The rear clearance 147 is provided on a rear side of the unmanned watercraft 101 in the sailing direction and has a rear opening 145 that communicates with the outside. The connection clearance 149 connects the front clearance 143 and the rear clearance 147. With such a configuration, a water channel is formed from the front opening 141 to the rear opening 145 through the front clearance 143, the connection clearance 149, and the rear clearance 147. As indicated by an arrow in FIG. 4, with flowing water, water is suctioned from the front opening 141. The connection clearance 149 is also formed outside a pair of side walls that oppose each other in a width direction of a container body 107B.

FIGS. 5A to 5C each illustrate a modified example of the cooling structure CS. In FIGS. 5A to 5C, only the unmanned watercraft 101 is illustrated in cross section, and the waterproof container 107 is not illustrated in cross section.

In the example illustrated in FIG. 5A, the front clearance 143 and the rear clearance 147 are set to have the same width dimension.

In the example illustrated in FIG. 5B, a position of the waterproof container 107 in the recess 105 is determined such that the front clearance 143 has the larger width dimension than the rear clearance 147. This is application of Bernoulli's principle that a velocity of a fluid increases and a pressure decreases when a channel is narrowed. In the example illustrated in FIG. 5B, the width dimension of the front clearance 143 is three times greater than the width dimension of the rear clearance 147. Accordingly, when the unmanned watercraft 1 sails, a pressure P to suction water from the front opening 141 becomes three times higher than a pressure P to suction water from the rear opening 145, and thus an amount of water suctioned from the front opening 141 can be increased.

In the example illustrated in FIG. 5C, arrangement positions of the central processing unit CPU1 for image recognition and the central processing unit CPU2 for control, which constitute the central processing unit CPU, in the waterproof container 107 are adjusted such that a part of the waterproof container 107 near the front opening 141 becomes higher in temperature than a part thereof near the rear opening 145 by heat (a circle drawn in the front part of the waterproof container 7 indicates that the part is at the high temperature). When a temperature of water around the front opening is increased by heat, a convection flow of water is generated. As a result, it is possible to increase the amount of water suctioned from the front opening 141.

Third Embodiment

Figure 6:
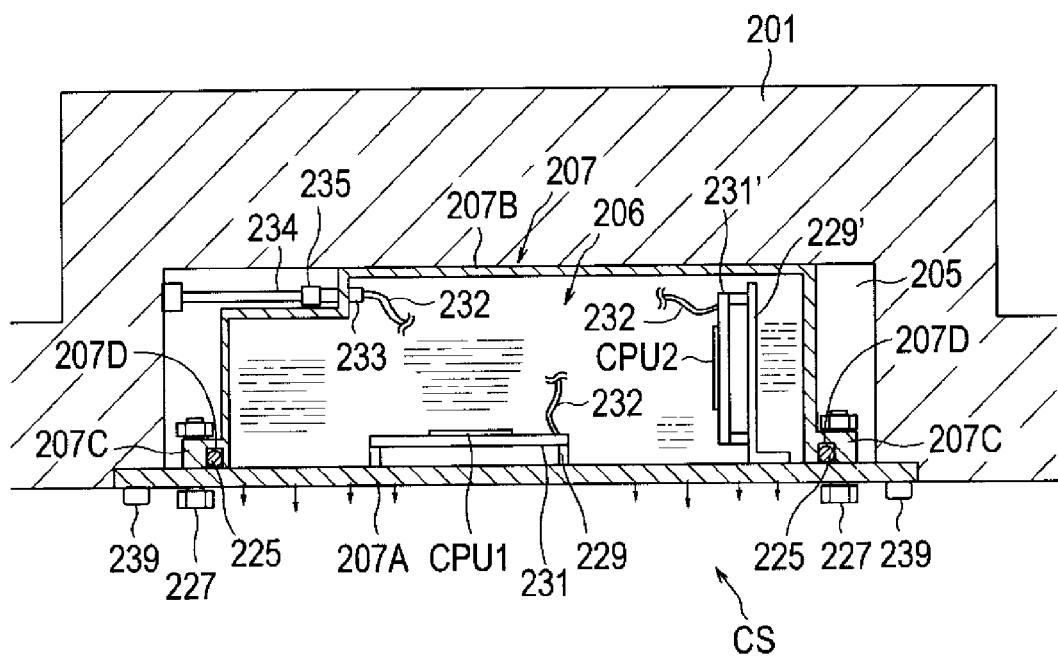
FIG. 6 is a cross-sectional view illustrating a cooling structure provided to an unmanned watercraft according to a third embodiment.

FIG. 6 is a cross-sectional view illustrating a cooling structure provided to an unmanned watercraft according to a third embodiment. Parts common to those in the first embodiment will be denoted by reference numerals that are obtained by adding 200 to those provided in FIG. 3, and a description thereon will not be made.

In the third embodiment, a waterproof container 207 is filled with Fluorinert®, which is a fluorine-based inert liquid. Fluorinert® has high heat transport efficiency and also has an insulating property. Thus, by filling the waterproof container 207 with Fluorinert®, the heat from the central processing unit CPU1 for image recognition and the central processing unit CPU2 for control, which constitute the central processing unit CPU, is transferred to walls of the waterproof container 207 via Fluorinert®. That is, in this configuration, the heat-conducting plates 37, 37' that are used in FIG. 3 are unnecessary.

Other Embodiments

In the above embodiment, the insulating envelope is constructed of the waterproof container 7 that is made of the metal. However, any component can be adopted as the insulating envelope as long as such a component has the electrical insulation property and surrounds the heat-generating body. For example, it is needless to say that the insulating envelope can be made of a hardened silicone resin.

In the above embodiment, the insulating envelope is constructed of the waterproof container 7 that is made of the metal. However, it is evident that the insulating envelope may be constructed of a waterproof container made of an insulating resin.

In the above embodiment, the central processing unit is described as the heat-generating body including the electrical equipment and/or the electronic equipment. However, the electrical equipment and the electronic equipment, such as a semiconductor element for driving a drive motor and a drive motor itself, each of which generates a certain amount of heat, are all included in the heating-generating bodies including the electrical equipment and/or the electronic equipment.

In the above embodiment, the waterproof container is accommodated in the recess that constitutes a part of the submerged part. However, it is needless to say that the waterproof container can be fixed to an outer surface of the submerged part without forming the recess in the submerged part.

The specific description has been made so far on the embodiments of the present invention. The present invention is not limited to these embodiments and it is needless to say that various modifications can be made thereto within the scope of the technical idea of the present invention.

INDUSTRIAL APPLICABILITY

The present invention can provide the unmanned watercraft capable of sufficiently cooling the heat-generating body that generates the large amount of heat, capable of cooling such a heat-generating body without using the energy in the watercraft, and capable of improving the mean time between failures (MTBF) of the cooling device. The present invention can further provide the unmanned watercraft, the equipment of which can be maintained without the need for the worker to board the watercraft.

DESCRIPTION OF REFERENCE NUMERALS 1 unmanned watercraft
3 submerged part
5 recess
6 heat-generating body
7 waterproof container
7A bottom wall
7B container body
7C flange
7D groove
9 global navigation satellite system (GNSS)
11 automatic identification system (AIS)
13 inertial measurement unit (IMU)
15 communication device
17 camera
19 infrared camera
21 radar
23 actuator
25 waterproof packing
27 fixture
29, 29' spacer
31, 31' printed circuit board
32 electrical wire
33 waterproof connector half
34 electrical wire
35 waterproof connector half
37, 37' heat-conducting plate
39 fixing screw
CPU1 central processing unit for image recognition
CPU2 central processing unit for control

The invention claimed is:

1. An unmanned watercraft having a cooling structure for cooling a heat-generating body that includes electrical equipment and/or electronic equipment, wherein
the cooling structure includes an insulating envelope, being a waterproof envelope, that surrounds the heat-generating body in an electrically insulated state,
the insulating envelope is arranged outside a submerged part of the unmanned watercraft so as to be in contact with water present outside the unmanned watercraft, the submerged part being submerged in water,
the submerged part of the unmanned watercraft has a recess that is opened outward, and
the insulating envelope is accommodated in the recess, and
the recess and the insulating envelope together configure a front opening and a rear opening to form a water channel.

2. An unmanned watercraft having a cooling structure for cooling a heat-generating body that includes electrical equipment and/or electronic equipment, wherein
the cooling structure includes an insulating envelope that surrounds the heat-generating body in an electrically insulated state,
the insulating envelope is arranged outside a submerged part of the unmanned watercraft so as to be in contact with water present outside the unmanned watercraft, the submerged part being submerged in water,
the insulating envelope is accommodated in a recess in the submerged part, and
the recess and the insulating envelope together configure a front opening and a rear opening to form a water channel.

3. The unmanned watercraft according to claim 2, wherein
the insulating envelope is a waterproof envelope.

4. The unmanned watercraft according to claim 3, wherein
the insulating envelope is constructed of a waterproof container that accommodates the heat-generating body.

5. The unmanned watercraft according to claim 4, wherein
the submerged part of the unmanned watercraft has a recess that is opened outward.

6. The unmanned watercraft according to claim 5, wherein
equipment mounted on the unmanned watercraft and the heat-generating body in the insulating envelope are electrically connected via a connector arranged in the recess.

7. The unmanned watercraft according to claim 5, wherein
the insulating envelope is fixed in the recess so as to be separable from a hull of the unmanned watercraft.

8. The unmanned watercraft according to claim 5, wherein
at least a part of the insulating envelope that comes in contact with water is formed of a metal member, and
the heat-generating body is fixed in the insulating envelope in a manner that the heat-generating body is able to transfer heat to the part of the insulating envelope that comes in contact with water.

9. The unmanned watercraft according to claim 5, wherein
shapes and structures of the recess and the insulating envelope are configured to suction water into the recess, to generate a water flow around the part of the insulating envelope that comes in contact with water, and to thereafter discharge the water in the generated water flow to outside the recess when the unmanned watercraft sails.

10. The unmanned watercraft according to claim 9, wherein
in a state where the insulating envelope is accommodated in the recess, a front clearance, a rear clearance, and a connection clearance are provided between the recess and the insulating envelope, the front clearance being provided on a front side of the unmanned watercraft in a sailing direction and having the front opening that communicates with the outside, the rear clearance being provided on a rear side of the unmanned watercraft in the sailing direction and having the rear opening that communicates with the outside, and the connection clearance connecting the front clearance and the rear clearance, and the water channel is formed from the front opening to the rear opening through the front clearance, the connection clearance, and the rear clearance.

11. The unmanned watercraft according to claim 10, wherein
width dimensions of the front opening, the front clearance, the rear opening, and the rear clearance are determined such that a pressure of water flowing through the front opening and the front clearance becomes higher than a pressure of water flowing through the rear opening and the rear clearance.

12. The unmanned watercraft according to claim 10, wherein
a part of the insulating envelope near the front opening is higher in temperature than a part of the insulating envelope near the rear opening by the heat of the heat-generating body.

* * * * *